(12) United States Patent
Ehrenberg

(10) Patent No.: US 7,906,978 B2
(45) Date of Patent: Mar. 15, 2011

(54) DEVICE FOR MEASURING OR INSPECTING SUBSTRATES OF THE SEMICONDUCTOR INDUSTRY

(75) Inventor: Tillmann Ehrenberg, Schoeffengrund (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 160 days.

(21) Appl. No.: 12/316,344

(22) Filed: Dec. 11, 2008

(65) Prior Publication Data
US 2009/0189157 A1   Jul. 30, 2009

(30) Foreign Application Priority Data

Jan. 24, 2008   (DE) .................. 10 2008 002 756

(51) Int. Cl.
*G01R 31/02*   (2006.01)
(52) U.S. Cl. .............................. 324/750.19; 324/750.22
(58) Field of Classification Search .......... None
See application file for complete search history.

(56) References Cited

U.S. PATENT DOCUMENTS

| 5,678,944 | A | 10/1997 | Slocum et al. |
| 6,962,471 | B2 | 11/2005 | Birkner et al. |
| 2004/0258505 | A1 | 12/2004 | Wu |

FOREIGN PATENT DOCUMENTS

| DE | 4235677 A1 | 4/1994 |
| DE | 10053232 C2 | 5/2002 |
| DE | 10323662 A1 | 12/2004 |
| EP | 0899776 A1 | 3/1999 |
| WO | WO 99/10915 | 3/1999 |

*Primary Examiner* — Jermele M Hollington
(74) *Attorney, Agent, or Firm* — Simpson & Simpson, PLLC

(57) ABSTRACT

A device for measuring or inspecting substrates of the semiconductor industry, including a base frame and a module detachably mounted thereon via a module frame, wherein the module frame is detachably connected to the base frame via at least two self-aligning coupling elements and at least one alignment element, wherein the base frame and the module frame are in exactly defined spatial alignment with each other, when the module frame is detachably connected to the base frame.

17 Claims, 12 Drawing Sheets

DEVICE FOR MEASURING OR INSPECTING SUBSTRATES OF THE SEMICONDUCTOR INDUSTRY

CROSS REFERENCE TO RELATED APPLICATIONS

This patent application claims priority of German Patent Application No. 10 2008 002 756.1, filed on Jan. 24, 2008, the application is incorporated herein by reference.

FIELD OF THE INVENTION

The present invention relates to a device for measuring or inspecting substrates of the semiconductor industry. In particular, the invention relates to a device including a base frame with a module detachably mounted thereon via a module frame.

BACKGROUND OF THE INVENTION

Substrates of the semiconductor industry are handled, inspected and/or measured in inspection machines or coordinate measuring machines. Substrates for the semiconductor industry are, for example, wafers, masks for the production of wafers or flat panel displays. The inspected and/or measured substrates may, for example, be disk-like wafers usually consisting of silicon or gallium arsenide. However, substrates may also be masks having structures applied thereto, which serve as patterns for wafer exposure. During production and the inspection of the semiconductor wafers, the substrates are transported in various types of cartridges to various work stations, where they must be inserted into the respective work station. The transport may be manual or automated.

The work stations serve various purposes in the treatment of the substrates, such as inspection, measurement or processing of the substrates. During inspection, the substrates are optically inspected particularly for undesired particles on the substrates or for defects in the structures on or in the surface of the substrates. The inspection may be performed by the user or automatically with the help of an electronic camera. In such work stations or also in separate ones, measurements may additionally be performed on the substrates. Width (CD), distance or thickness of the structures are preferably measured in the coordinate measuring machine. In most cases, the systems or devices for these applications of inspection and/or measurement include a central work station capable of having at least one further module added thereto. The further module allows performing further examinations and/or manipulations of the substrate.

Further common requirements for such systems are high reliability, simple operability and uncomplicated maintenance. At the same time, there are high requirements with respect to substrate handling, such as safety, speed and clean handling. The transfer of the substrates from the system to the module is set once so that the handling robot knows a defined transfer position. If the module is removed for maintenance purposes, it is important to ensure that the once set position is re-occupied when the module is again mounted to the system.

Handling the substrates means transferring the substrates from the substrate supply module to one of the work stations. It is important that the substrates reach the work station and are finally returned to the substrate supply module unerringly and without being damaged.

DE 42 35 677 A1 discloses a transport unit for workpieces in a chamber of a vacuum processing installation, wherein the workpieces are transported in the area of an opening. Since the workpieces are handled in the same plane of the opening, several chambers may be combined in a modular way to form an installation configuration.

EP 0 899 776 A1 discloses an apparatus for the intermediate storage of wafers in a wafer processing installation with the help of an exchanger. A removal area may be arranged in any place on a front or lateral side wall of the exchanger.

None of these two publications discusses the type of connection or the connectors used between the units to be connected.

DE 100 53 232 C2 describes a system including one or more substrate supply modules and at least one work station comprising connecting elements on two or more different side walls, the connecting elements cooperating with corresponding connecting elements in at least one side wall of each substrate supply module. Examples of such connecting elements are, in particular, so-called kinematic couplings.

For many processing and inspecting steps, it is very important that the various areas between which there may be a transfer of substrates are arranged in exactly defined spatial alignment with each other. Therefore, exact alignment of the modules with respect to each other is generally essential. For all known ways of connecting several modules of a work station, the transfer position of the substrates to the station continues to be decisive. The exact transfer position can only be ensured by aligning the stations precisely to each other or to the work station respectively.

BRIEF SUMMARY OF THE INVENTION

It is an object of the present invention to provide a device allowing modular grouping of several modules around a system, wherein the aligning effort is reduced and maintenance is made easier.

This object is achieved by a device for measuring or inspecting substrates of the semiconductor industry. The device comprises a base frame and a module detachably mounted thereon via a module frame. The module frame is detachably connected to the base frame via at least two self-aligning coupling elements and at least one alignment element, wherein, in the connected state, the base frame and the module frame are in exactly defined spatial alignment with each other.

It is advantageous if the device for measuring or inspecting substrates of the semiconductor industry includes a base frame with a module detachably mounted thereon via a module frame. The module frame is detachably connected to the base frame with the help of at least two self-aligning coupling elements and at least one alignment element. In the connected state, the base frame and the module frame are in exactly defined spatial alignment with each other.

Preferably two self-aligning coupling elements and an alignment element are provided. The coupling element is of the self-aligning type so that the exact position of the parts coupled to each other is predetermined by the design of the coupling element. In the coupled state, the module frame and the base frame are spatially arranged in an exactly defined way with respect to each other so that no further alignment of the station is required after a coupling operation. The spatial alignment of a station with respect to the base and/or the entire system must be performed only once and is maintained in later decoupling and coupling operations, irrespective of how often or where the modular station is connected. The inventive self-aligning coupling element additionally facilitates all kinds of maintenance work, because after decoupling the parts can be re-mounted at any time without requiring any additional complex assembly.

One embodiment of the inventive modular station provides that the at least one coupling element includes at least two elements that are engageable with each other and, in a final position, are spatially arranged in an exactly defined way with respect to each other. In particular, the at least two elements of the coupling element may be formed by a pin on the one hand and by a corresponding receptacle on the other hand. Preferably, the pin and the corresponding receptacle are designed such that the pin is insertable into the receptacle in a defined direction and may be shifted therein until it reaches a defined final position. This ensures that, on the one hand, the receptacle has a certain tolerance for the insertion of the pin, so that it may be received within a certain area, but that, on the other hand, the receptacle and the pin define a unique spatial association due to their respective shaping and are thus suitable for accurately integrating a modular station for handling substrates into a machine having several such stations.

In the preferred embodiment, two self-aligning coupling elements and an alignment element are provided for connecting the module to the base. For each coupling element, the module frame comprises a guide into which the coupling element is fitted.

In particular, it may be provided that the pin is set without play in the defined final position within the receptacle. It is useful for the pin and the receptacle to have at least two different contact surfaces for two different direction components. For example, the pin may have a cylindrical portion which, in the defined final position, is received in a corresponding first contact surface having a semicircular cross-section. In addition, the pin may have a shoulder adjacent to the cylindrical portion which, in the defined final position, is arranged against a corresponding second contact surface. It is also useful if the second contact surface of the receptacle is oriented to be approximately perpendicular to the first contact surface.

A further alternative of the inventive station may provide that the at least one coupling element is adjustable in at least one direction. In particular, the at least one coupling element may be provided to be adjustable in a direction approximately perpendicular to the shift direction between a contact position and the final position. The coupling elements are preferably fixed after they have been mounted, which may, for example, be achieved by simple clamping with screws. The mutually engaging surfaces of the at least one coupling element are preferably subjected to fine machining and may, for example, be precisely cut and/or lapped, which ensures a highly precise dimensional accuracy of the surfaces and thus a very precise fit of the coupling elements after an alignment process.

The base frame may, for example, be part of a handling, processing and/or inspection machine receiving several modular stations. In this case, the module frame is part of a handling, processing and/or inspection module of a more complex machine. With the help of the above-mentioned coupling elements, each arranged in the same position, the modular stations may be repositioned and exchanged as desired with nearly no limitations, wherein an optimally aligned final position is guaranteed.

The invention further relates to a handling, processing and/or inspection system for components and/or substrates, particularly for semiconductor substrates, including at least one housing and/or one frame portion for receiving several modular stations according to at least one of the embodiments described above, which may each be coupled detachably and in exactly definable spatial association with the housing and/or with the frame portion by means of one or more coupling elements.

BRIEF DESCRIPTION OF THE SEVERAL VIEWS OF THE DRAWINGS

In the following, embodiments will explain the invention and its advantages in more detail with reference to the accompanying drawings, in which.

DETAILED DESCRIPTION OF THE INVENTION

Figure 1:
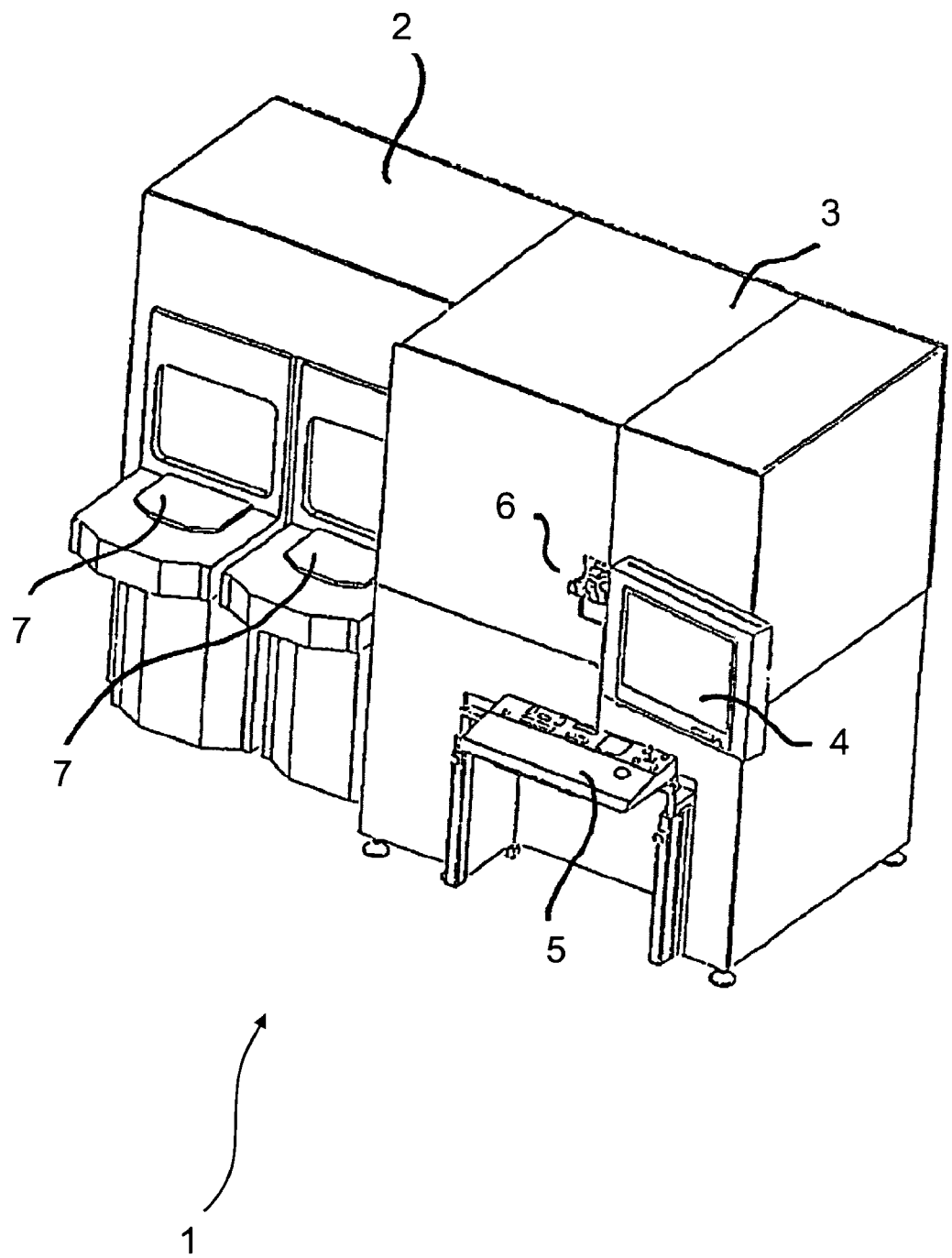
FIG. 1 shows a spatial representation of a handling, processing and/or inspection system for components and/or substrates.

The spatial representation of FIG. 1 exemplarily shows a possible configuration of a prior art device for handling, processing and/or inspecting components and/or substrates of the semiconductor industry. The device 1 may, for example, include a substrate supply module 2 and a work station 3. The general external view also shows a display 4 with which users may check the input they provide via an input means 5 or follow the status of the substrate handling or view results of the operations in the work station 3, etc. If there is a camera installed in the work station 3, the display 4 may also display images of the substrate. If necessary, the substrate may also be observed directly with a microscope via a microscope viewer 6. The substrate supply module 2 may optionally comprise two or more load ports 7 for substrates to be supplied.

Figure 2:
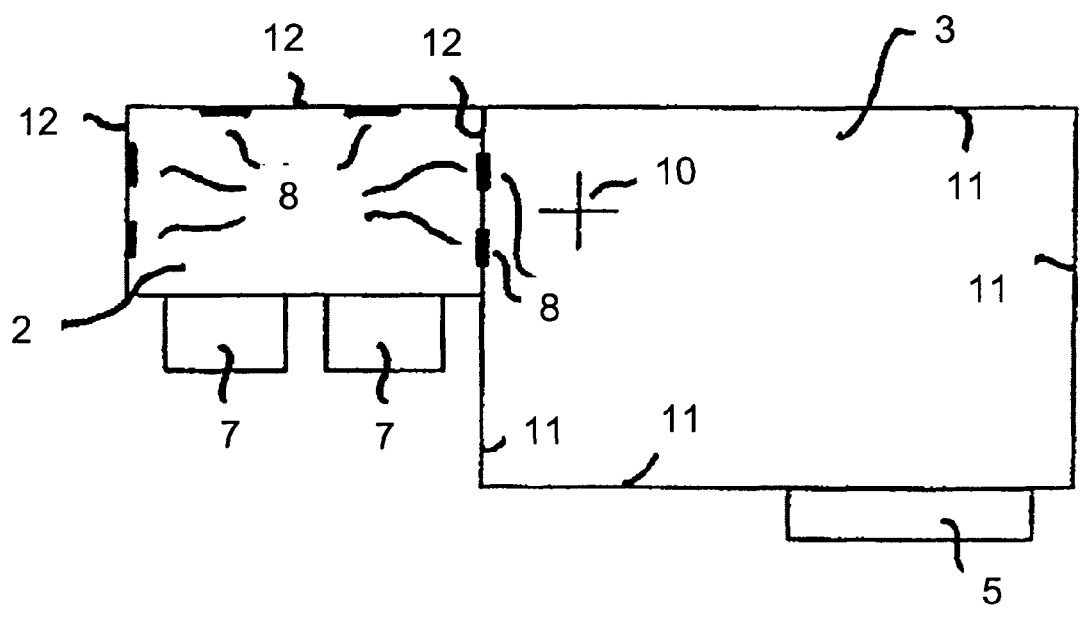
FIG. 2 shows an exemplary arrangement of several stations connected to each other by means of coupling elements.
Figure 2:

The schematic representation of FIG. 2 shows an exemplary arrangement (prior art) of several stations connected to each other by means of coupling elements 8. FIG. 2 shows the substrate supply module 2 arranged on one side of the work station 3, which is provided with the input means 5. The input means 5 defines the front of the work station 3 or the system 1 consisting of substrate supply module 2 and work station 3.

In this embodiment, the substrate supply module 2 is oriented with respect to the work station 3 such that it may be loaded with substrates at the front via its load ports 7. Normally, two such load ports 7 are provided. Open design or closed cartridges are used for this purpose, which are inserted into the load ports 7 manually by the user or by automation, for example by means of a robot (not shown). The cartridges may be filled with substrates, or they may be empty, depending on the intended work process. For example, all cartridges may be filled, and the substrates are first taken from one cartridge, inserted into the work station 3 and returned to the same cartridge after they have been processed therein. Subsequently this process is repeated for the next cartridge, while the user collects the cartridge with the processed substrates and inserts a new cartridge with substrates into the free load port 7. On the other hand, the substrates may also be removed from the one cartridge and sorted into the other, initially empty cartridge after passing through the work station 3. Generally, it is obvious that, instead of two load ports 7, only a single load port 7 or three or more load ports 7 may optionally also be provided.

The substrate supply module 2 and the work station 3 are connected with each other by mechanical coupling elements 8. The coupling elements 8 establish a variable but precise connection. Therefore, the connection must be precise so that the transfer of the substrates between the substrate supply module 2 and the work station 3 can be performed quickly and smoothly. Advantageously, a fixed transfer point 10 is provided for the transfer of the substrates in the work station 3. A precise connection with the coupling elements 8 thus allows a precise transfer. Particularly so-called kinematic couplings, which effect an automatic alignment when the system 1 is assembled from various modular stations 2 and 3, may be used as connecting or coupling elements 8. Maintenance work is substantially facilitated because, due to the coupling elements 8, the substrate supply module 2 and the work station 3 are easily detached and re-coupled in a reproducible, precise way.

Optionally, the coupling elements 8 may be arranged on all side walls 11 of the work station 3 and/or on all side walls 12 of the substrate supply module 2 or only on some of the side walls 11 and 12, depending on the desired degree of variability. If the coupling elements 8 are arranged on all side walls 11 and 12 respectively, there are hardly any limits to the possible configurations of a variable number of diverse modular stations.

Figure 3:
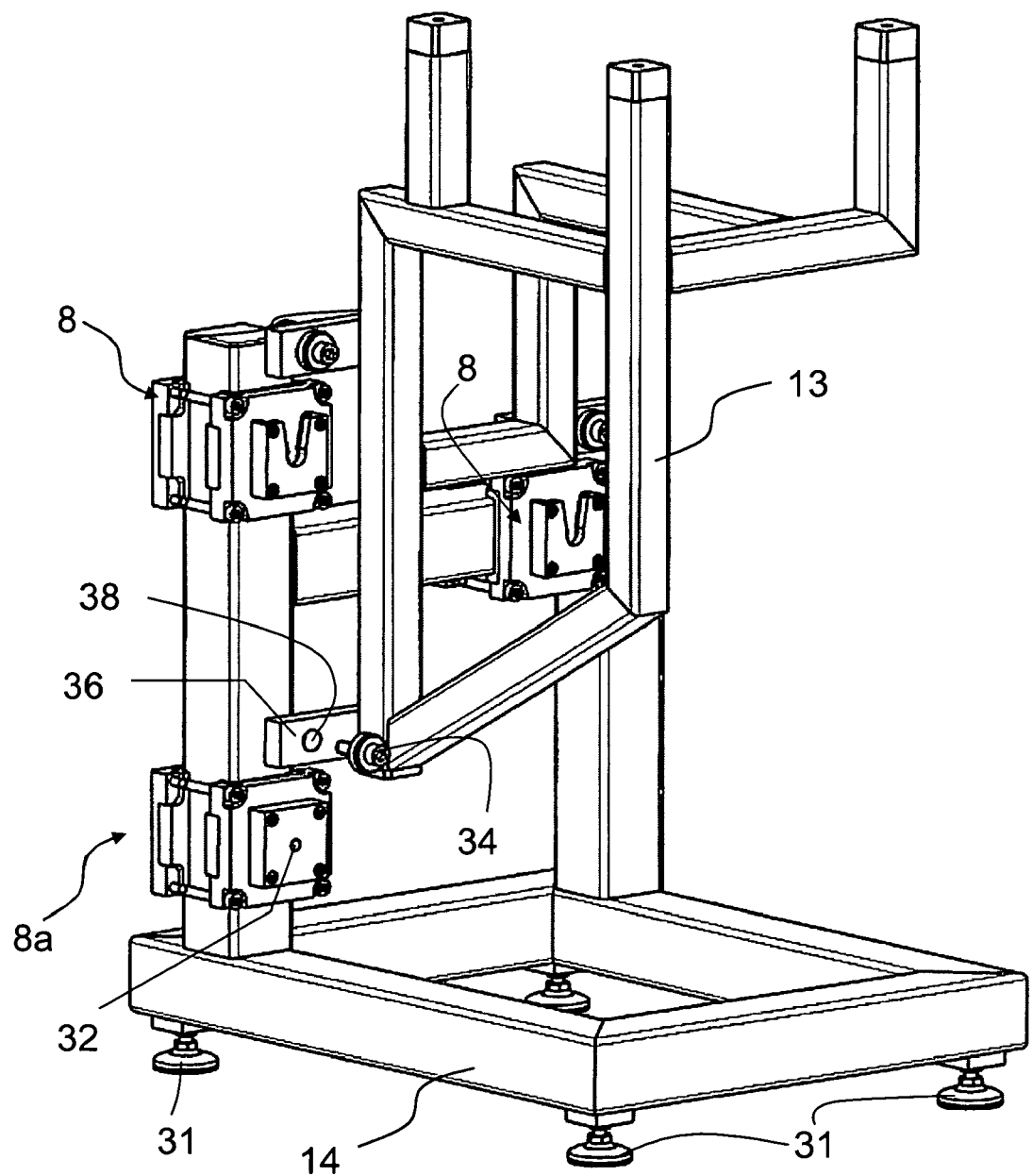
FIG. 3 shows a schematic perspective view of an embodiment of a modular station anchorable to a base frame by means of several coupling elements.
Figure 4:
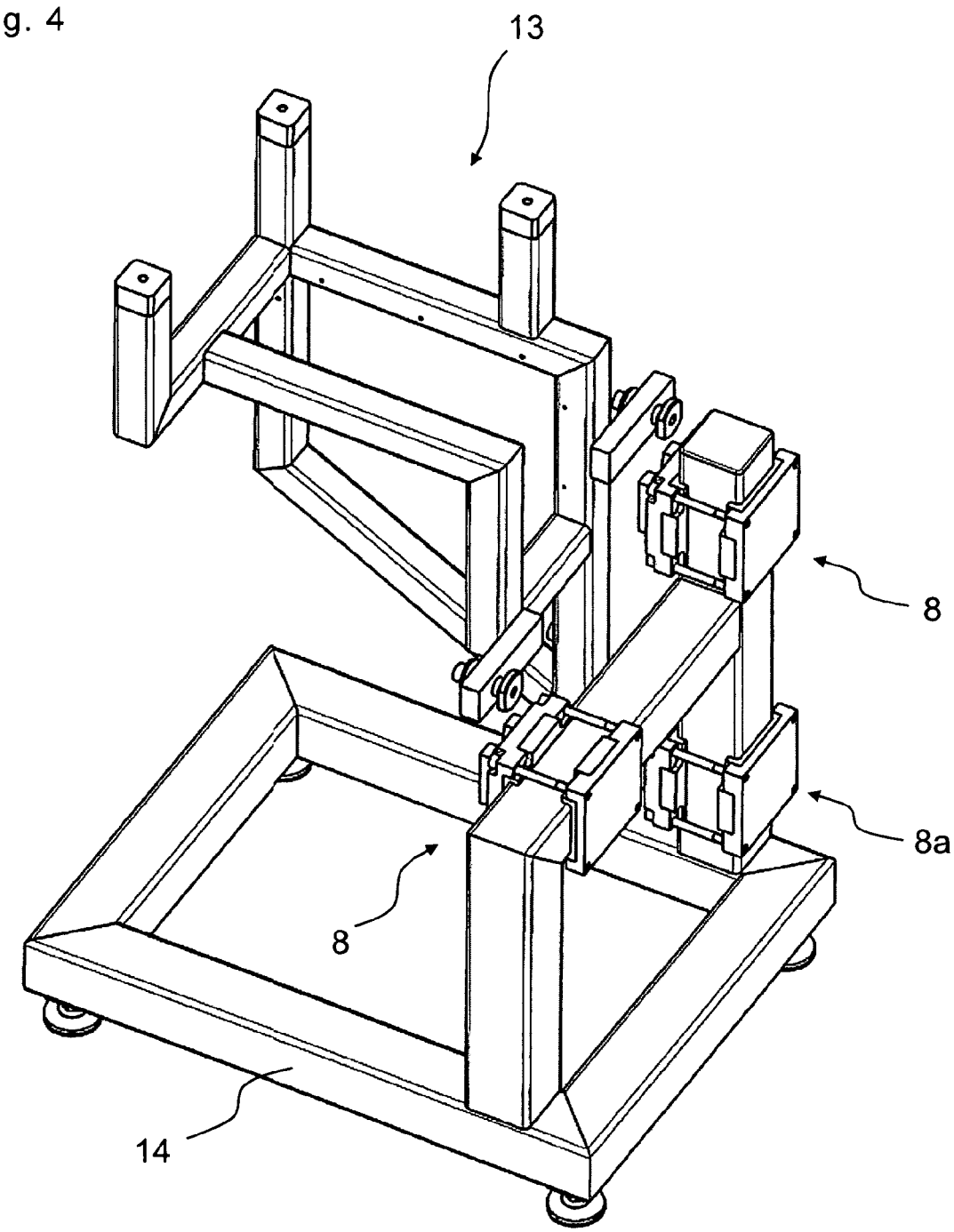
FIG. 4 shows another perspective view of the modular station of FIG. 3.

FIGS. 3 and 4 show perspective schematic views of an embodiment of how the module is fixed to the base frame 14 of the system via a module frame 13. In the embodiment shown, two coupling elements 8 and an alignment element 8a are used for the mounting. This allows a perfectly fitting and precise connection of a modular station to a larger system unit. Module frame 13 with the two coupling elements 8 and the alignment element 8a is detachably mounted on the base frame 14. The base frame 14 may, for example, be part of a work station or may be arranged in a housing of a handling, processing and/or inspection system. Optionally, the base frame 14 may also be designed differently, as long as there is a vertical anchoring surface for the coupling elements 8. FIGS. 3 and 4 show the base frame 14 and the module frame 13 in an unconnected state. The alignment element 8a is provided with a thread 32 into which a screw 34 fastens the module frame 13 on the base frame 14 via a mounting plate 36. The mounting plate 36 has an opening 38 for the screw 34, which is substantially larger than the diameter thereof. Due to the larger opening 38, the thread 32 is thus always accessible for the screw irrespective of the positioning of the module frame 13 in the coupling elements 8.

Figure 5:
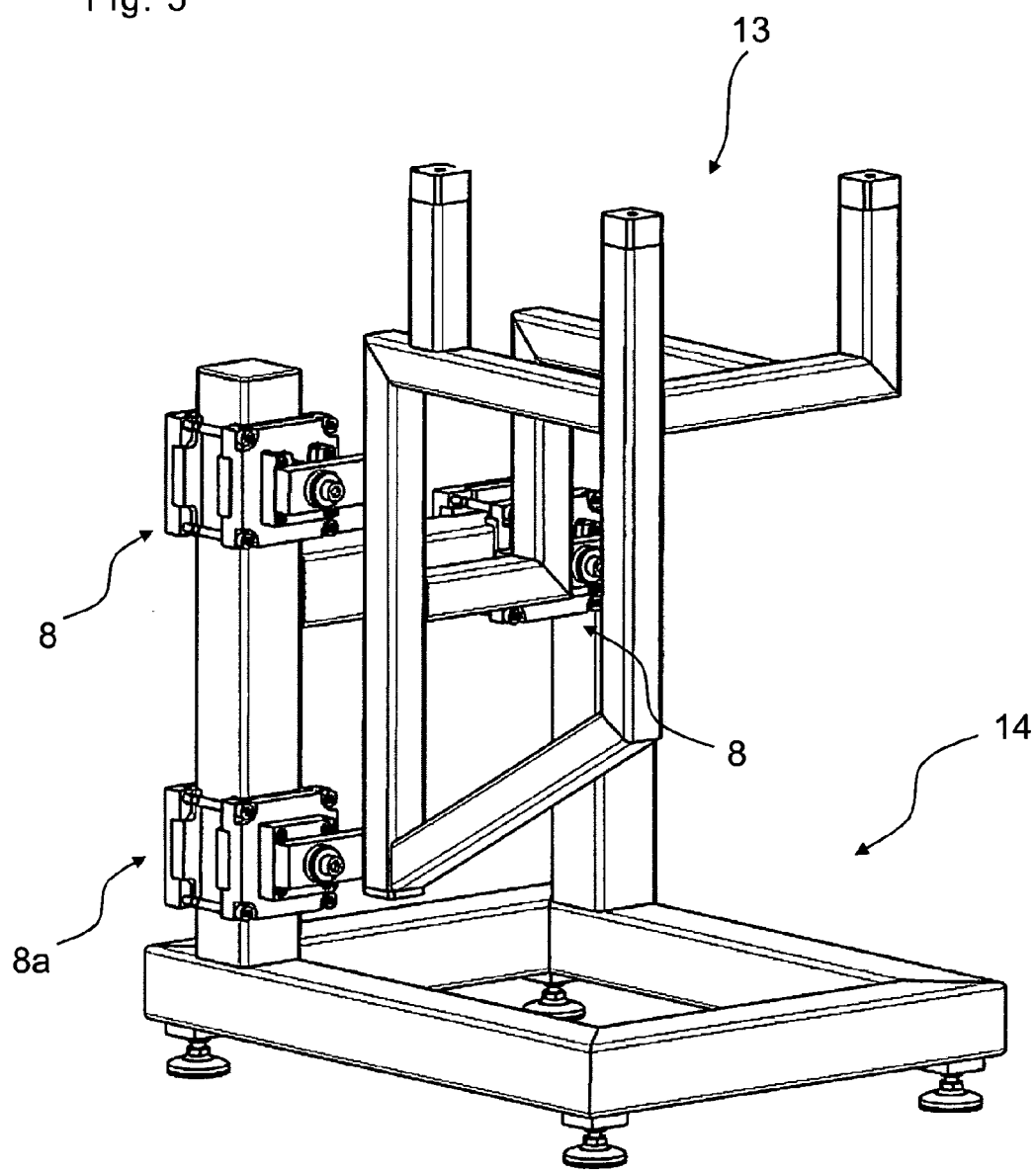
FIG. 5 shows a further perspective view of the modular station of FIG. 3 and FIG. 4.
Figure 6:
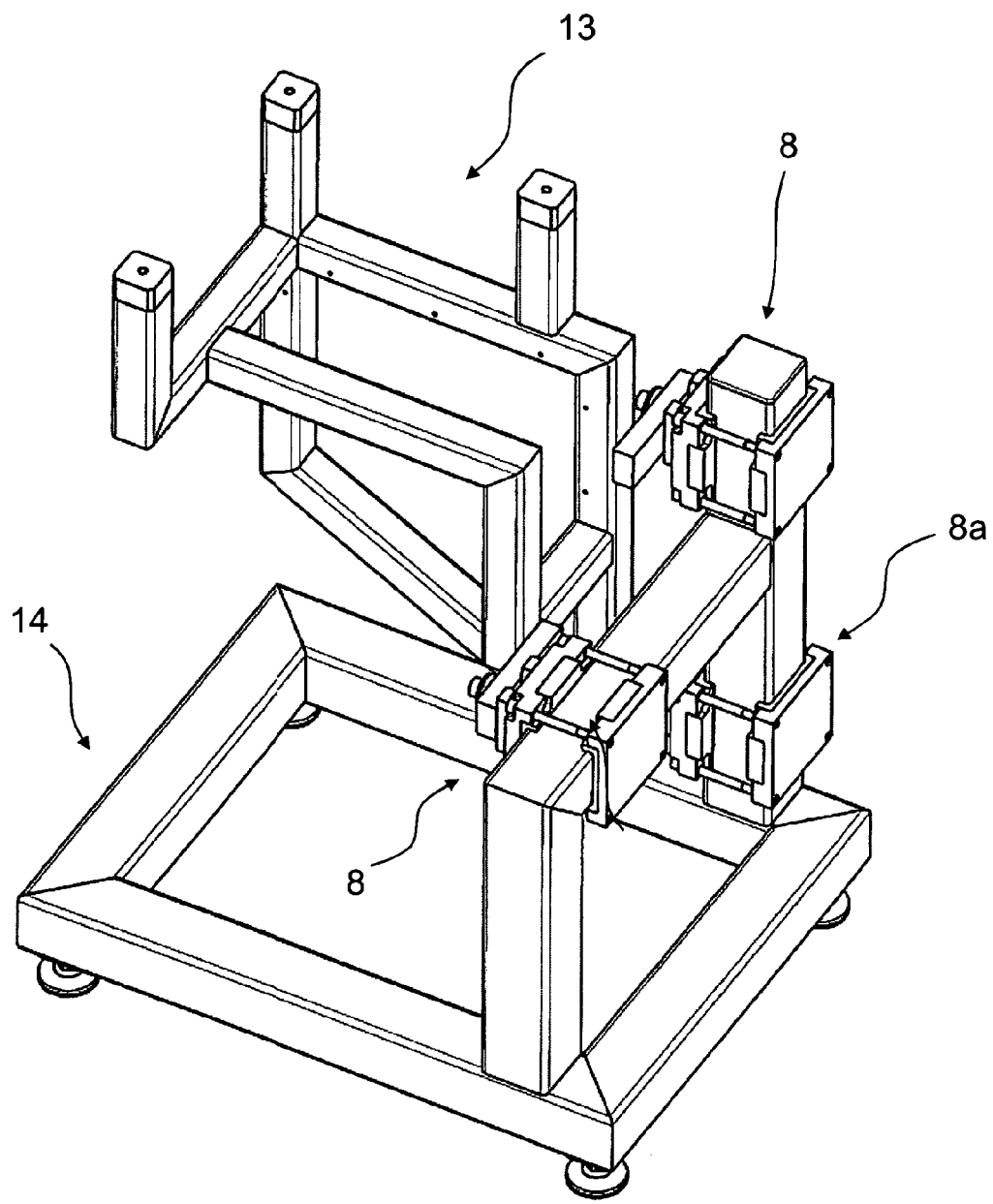
FIG. 6 shows another perspective view of the modular station of FIG. 5.
Figure 7:
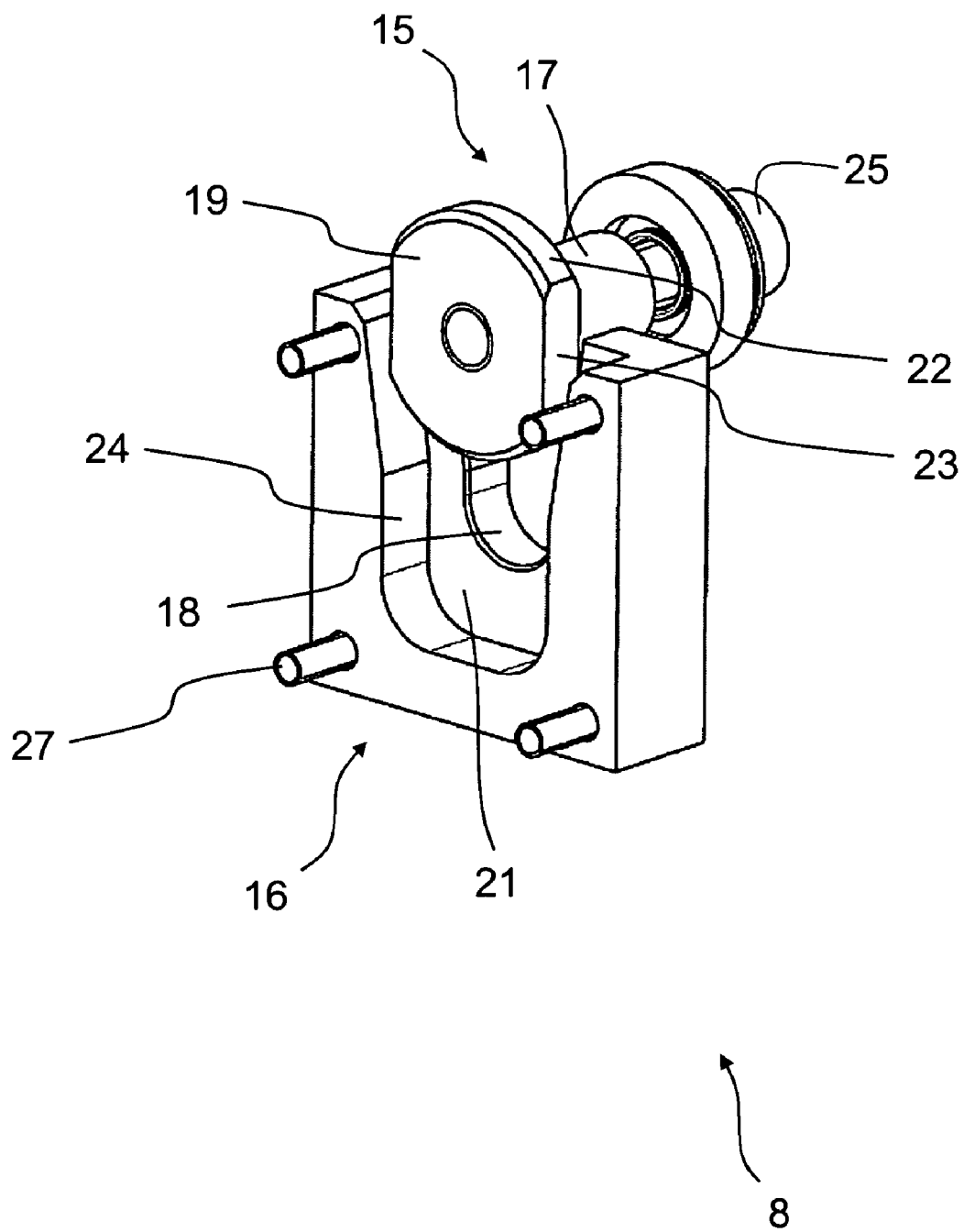
FIG. 7 shows a schematic perspective view of a two-piece coupling element for connecting the station to the base frame.
Figure 8:
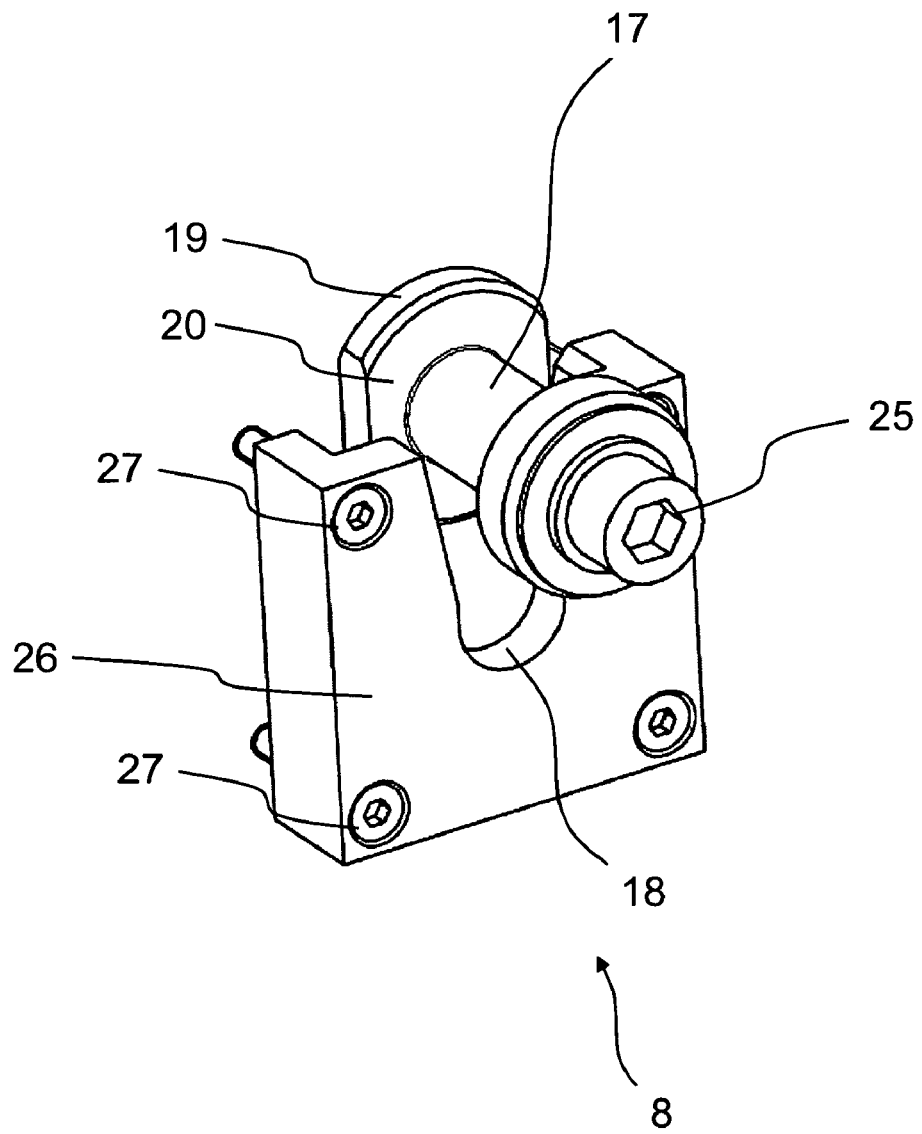
FIG. 8 shows a perspective view of the coupling element of FIG. 7.
Figure 9:
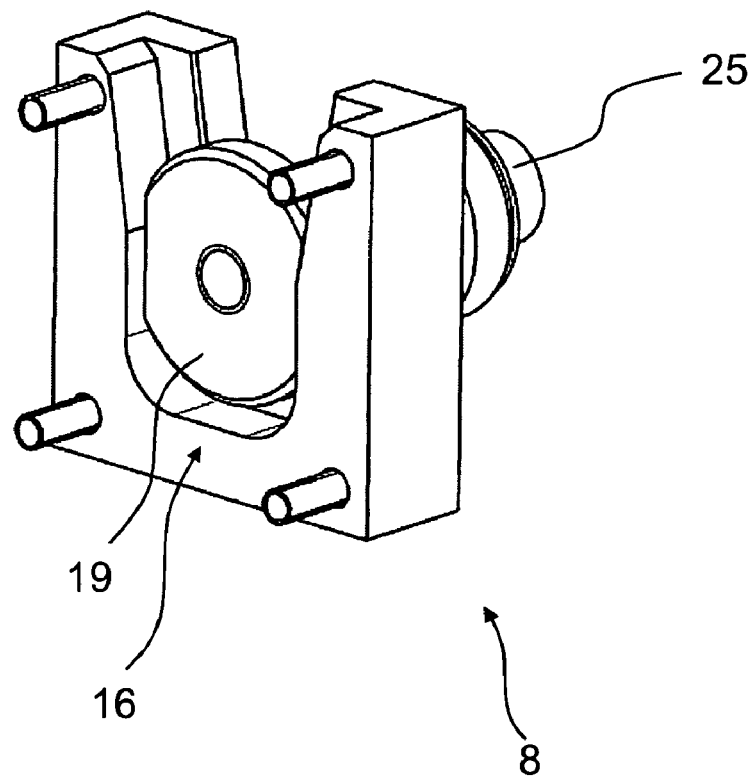
FIG. 9 shows a perspective view of the coupling element of FIG. 8.
Figure 10:
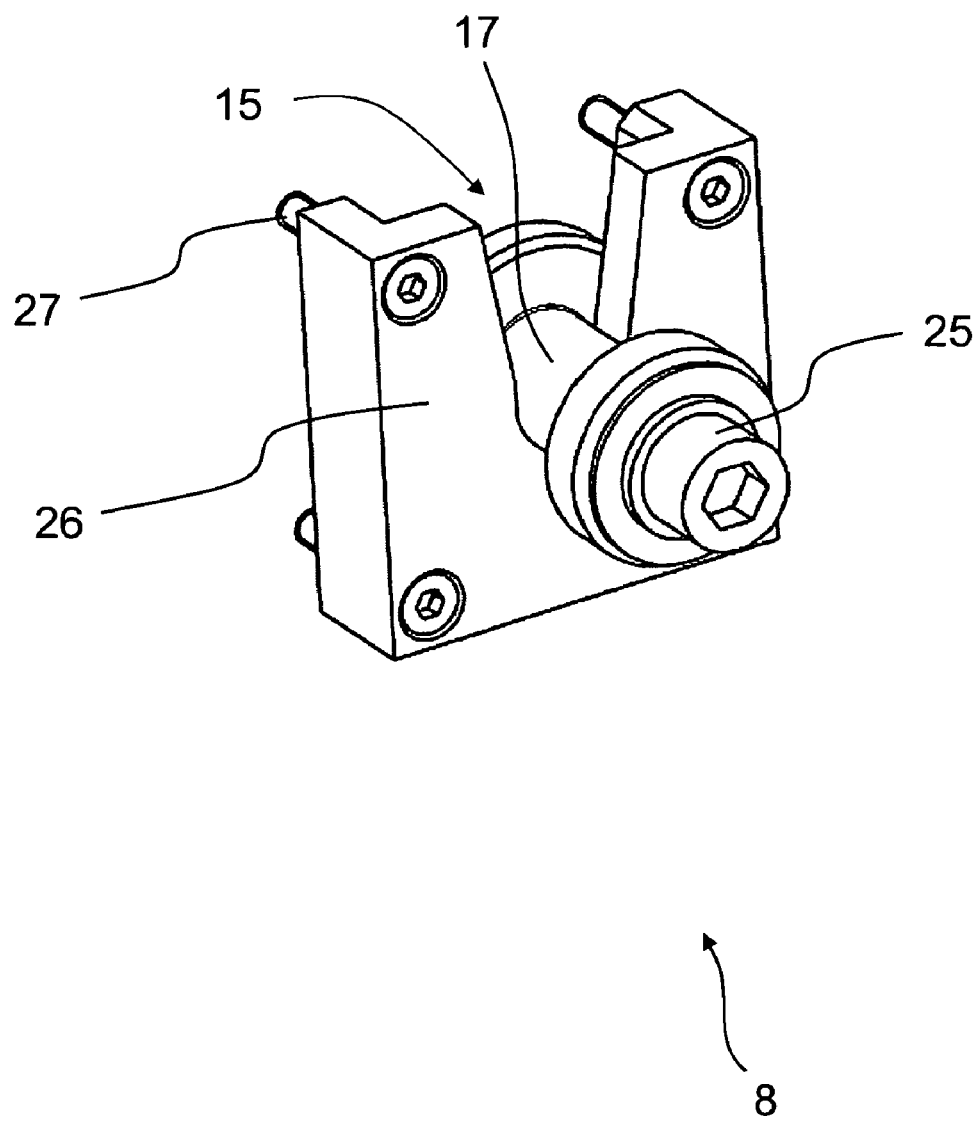
FIG. 10 shows a perspective view of the coupling element of FIG. 9.

FIGS. 5 and 6 show perspective schematic views of the base frame 14 and the module frame 13 in a connected state. As can be seen from FIGS. 3 to 6, the two coupling elements 8 permit the module frame 13 to be positioned vertically in a defined position on the base frame 14 and lowered a defined distance, wherein the alignment element 8a may optionally be designed such that the module frame 13 is fixed by means of screws after it has been lowered, as illustrated in FIG. 3. In the embodiment shown, the two coupling elements 8 are designed so that the module frame 13 may be lowered and lifted only in a vertical direction, while other movement components are impossible.

As will be explained in more detail with reference to the following drawings, the two coupling elements 8 each comprise additional fastening screws 25 for clamping the pins 15 in the receptacles 16. This clamping allows the pins 15, which are first mounted slidably, to be fixed in an unslidable way in the two coupling elements 8 by tightening the fastening screws 25, after they have reached their intended final position.

FIGS. 7 to 10 show various detail views of the two-piece coupling element 8 for connecting the module frame 13 to the base frame 14. The coupling element 8 according to the present embodiment substantially includes a cylindrical pin 15 engageable with a corresponding receptacle 16. The pin 15 may be inserted into the receptacle 16 and may be shifted therein until it reaches a defined final position. The pin 15 is mounted on the module frame 13, fitted in a guide 30. The receptacle 16 is mounted on the base frame 14. However, it is obvious that a kinematic inversion is also possible, where the pin 15 may be arranged on the base frame 14 and the receptacle 16 on the module frame 13. This does not affect the basic function of the coupling element 8.

It is essential for the function of the coupling element 8 that, in its defined final position, the pin 15 is fixed without play within the receptacle 16. This is ensured by providing several contact surfaces for two different direction components both on the pin 15 and on the receptacle 16. For example, the pin 15 has a cylindrical portion 17 which, in the defined final position, is received and supported on a first contact surface 18 of the receptacle 16 having a semicircular cross-section, which corresponds to the outer diameter of the cylindrical portion 17.

Furthermore, the pin comprises a shoulder 19 adjacent to the cylindrical portion 17, which, in the embodiment shown, has a disk-like shape with planar front surfaces 20. In the defined final position, an inner front surface 20 adjacent to the cylindrical portion 17 is arranged flat against a corresponding second contact surface 21 of the receptacle 16. The front surface 20 is arranged to be perpendicular to the outer lateral surface of the cylindrical portion 17 so that the second contact surface 21 is also necessarily oriented to be perpendicular to the surface of the first contact surface 18. The front surfaces 20 and the corresponding second contact surface 21 provide for the axial fixation of the pin 15 in the receptacle 16, while the cylindrical portion 17 of the pin 15 located on the first contact surface 18 provides for the radial fixation thereof.

The disk-like shoulder 19 of the pin 15 also comprises two further parallel, opposite contact surfaces 23 on its lateral surface 22, which, in the defined final position of the pin 15, are arranged without play against opposite third contact surfaces 24 of the receptacle 16 and provide an additional fixation of the pin 15. The disk-like shoulder 19, together with third contact surfaces 24, also forms a rotation lock when the fastening screw 25 is to be tightened. The third contact surfaces 24 are arranged to be perpendicular to the second contact surface 21 and parallel to the first contact surface 18.

By means of the fastening screw 25 arranged opposite to the shoulder 19, the pin 15 may be mounted to the module frame 13 via the respective coupling element 8 and may, if necessary, still be shifted in the axial direction, wherein the front surface 20 should not contact the second contact surface 21 yet for this purpose. The single adjustment of the two coupling elements 8 is preferably performed by suitable measuring means and normally does not have to be changed even if the modular stations are rearranged and/or exchanged repeatedly, because the two or more coupling elements 8 allow an exactly reproducible mountability of the module frames 13 to the base frame 14.

The various contact surfaces providing the exact positioning of the pin 15 in the receptacle 16 are preferably exactly tailored, for example cut and/or lapped after shaping, so that the mutually engaging surfaces allow optimal alignment with a minimum of tolerance.

A base plate 26 of the receptacle 16 may be anchored on the base frame 14 by means of suitable screw elements, wherein this screw connection must preferably be rigid and with a minimum of play so that undesired resilience cannot cause dimensional variations when the modular stations are mounted. The screw connections are established by the four clamping screws 27 shown, which are each arranged in one of the corners of the base plate 26.

Figure 11:
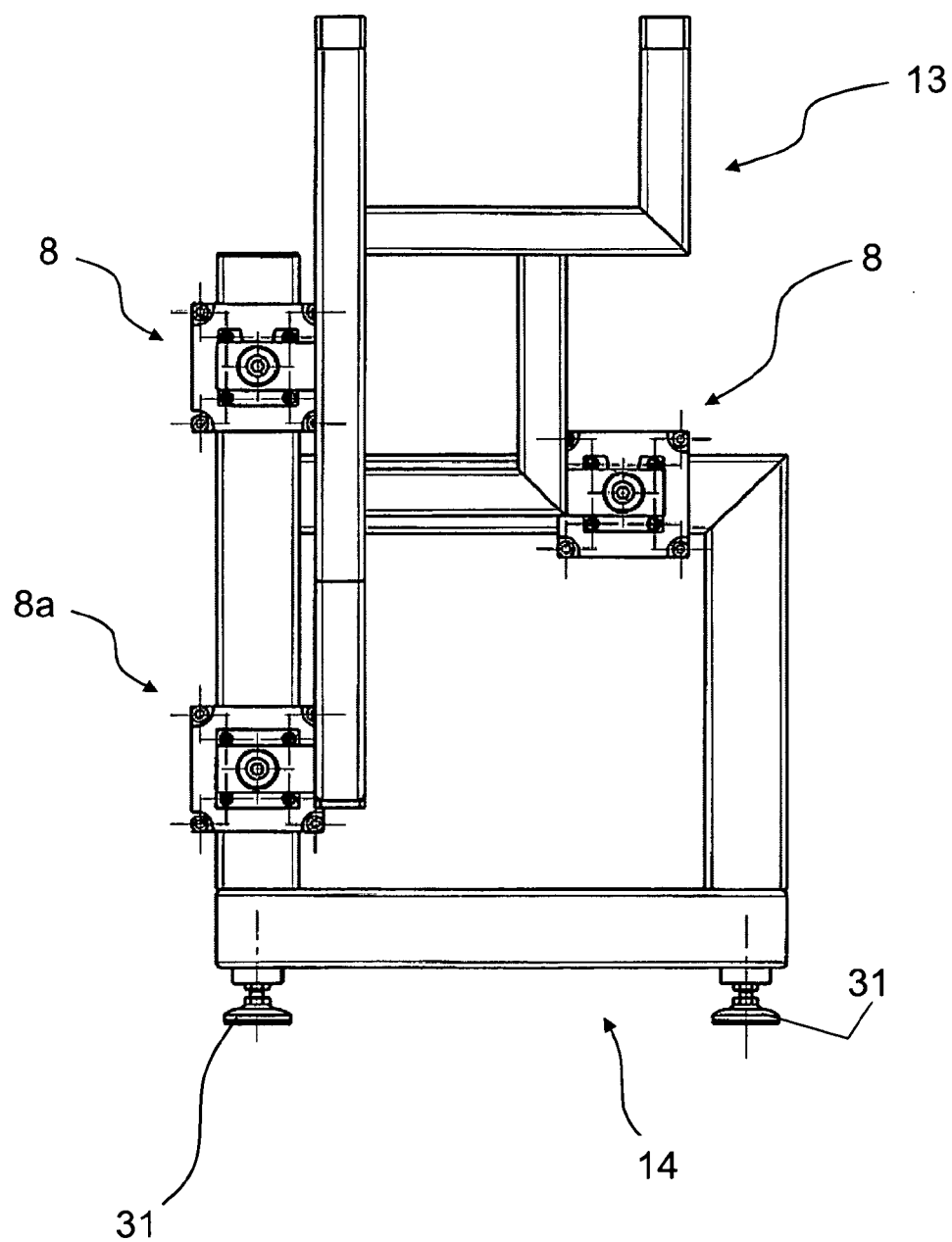
FIG. 11 shows a front view of the modular station anchored to the base frame.
Figure 12:
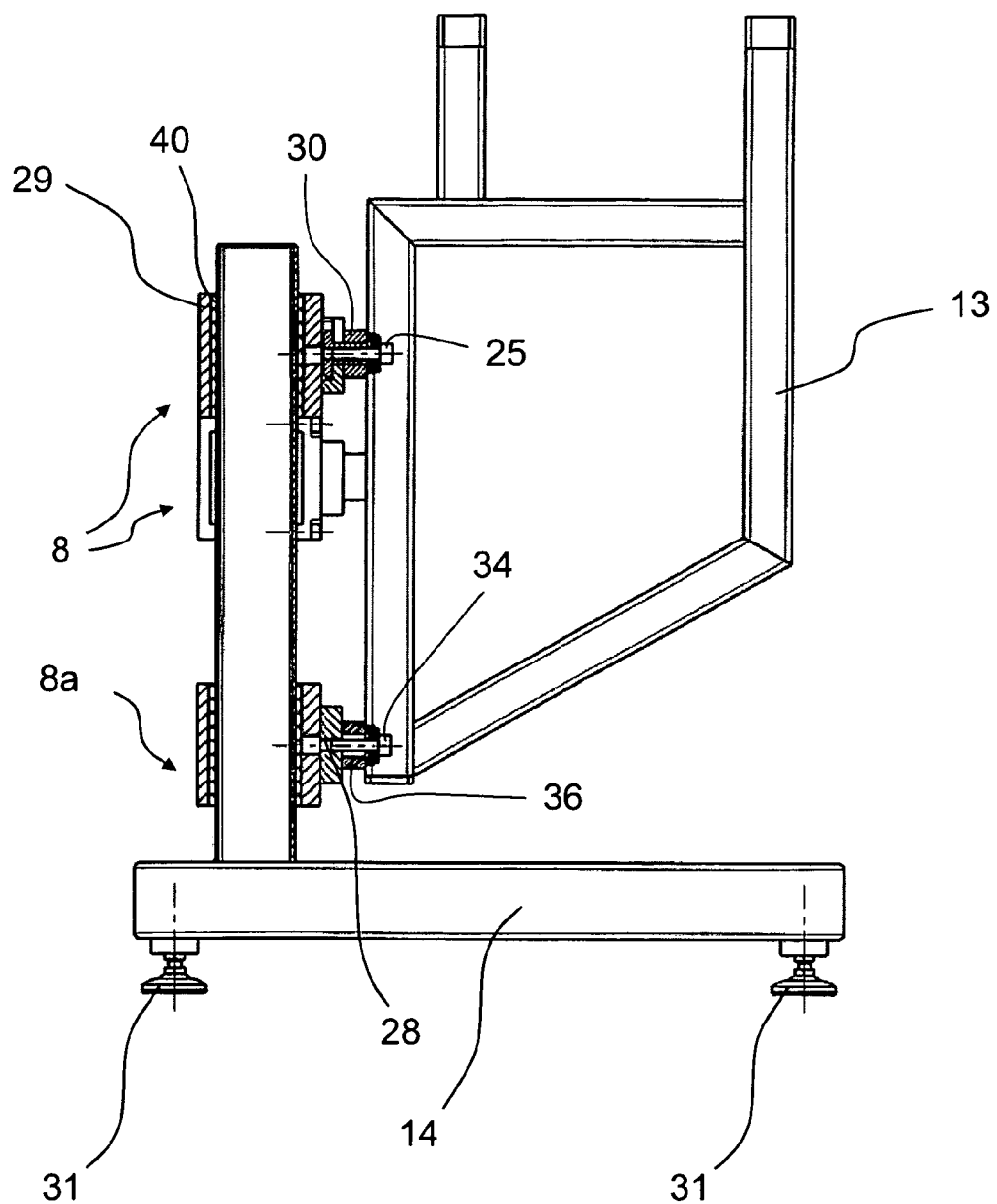
FIG. 12 shows a schematic side view of the modular station anchored to the base frame.

The schematic front view of FIG. 11 shows a modular station with its module frame 13, which is anchored to the base frame 14. The illustration of FIG. 12 shows a schematic side view of the modular station anchored to the base frame 14. In this view, the alignment element 8a is illustrated as a pure slip-in support, which is fixed only with the screw 34. While the two coupling elements 8 are fixed by inserting the pins 15 from above into the receptacles 16, whereupon the fastening screws 25 are tightened, in the case of the alignment element 8a, the screw 34 is inserted into a corresponding hollow cylindrical opening 38 and remains axially fixed in one direction in its final position after its has been screwed in and tightened.

The base plates 26 are screwed to the base frame 14 by means of counter-plates 29, if necessary including a cushioning intermediate layer 40 made of plastic, as can be seen from FIG. 12.

If necessary, the base frame 14 may comprise adjustable legs 31, but may optionally also be an integral part of a housing portion and arranged in a uniquely defined spatial position with respect thereto.

The invention has been described with reference to a preferred embodiment. However, someone skilled in the art will understand that modifications or changes may be made to the invention without departing from the scope of the following claims.

LIST OF REFERENCE NUMERALS 1 device
2 substrate supply module
3 work station
4 display
5 input means
6 microscope viewer
7 load ports
8 coupling element
8a alignment element
10 transfer point
11 side walls
12 side walls
13 module frame
14 base frame
15 pin
16 receptacle
17 cylindrical portion
18 first contact surface
19 shoulder
20 front surface
21 second contact surface
22 lateral surface
24 third contact surfaces
25 fastening screw
26 base plate
27 clamping screws
29 counter-plates
30 guide
31 legs
32 thread
34 screw
36 mounting plate
38 opening
40 intermediate layer

The invention claimed is:

1. A device for measuring or inspecting substrates of the semiconductor industry, comprising:
    a base frame;
    a module frame for detachably mounting a module;
    at least two self-aligning coupling elements and at least one alignment element for detachably connecting the module frame to the base frame, wherein each self-aligning coupling element has a pin and a receptacle, wherein the pin and the receptacle are operatively arranged to engage with each other;
    wherein the base frame and the module frame are in exactly defined spatial alignment with each other when the pin and the receptacle are connected to each other, wherein the pin is insertable into the receptacle in a defined direction and is shifted therein until it reaches a final position, where the pin and the receptacle are spatially arranged in an exactly defined way with respect to each other when in the final position, and wherein the pin and the receptacle comprise a first contact surface and a second contact surface for two different direction components; and,
    wherein the pin comprises a cylindrical portion, wherein the cylindrical portion of the pin is received by the first contact surface when in the final position, the first contact surface having a substantially semicircular cross-section, wherein the pin comprises a shoulder adjacent to the cylindrical portion, wherein the shoulder is arranged against the second contact surface when in the final position, and wherein the second contact surface is approximately perpendicular to the first contact surface.

2. The device recited in claim 1 comprising exactly two self-aligning coupling elements and one alignment element.

3. The device recited in claim 1, wherein, in the defined final position, the pin is fixed without play in the receptacle.

4. The device recited in claim 1, wherein the at least two coupling elements are adjustable in at least one direction.

5. The device recited in claim 1, wherein the module frame comprises a guide for each coupling element, into which the coupling element is fitted.

6. The device of claim 1, wherein the module frame may be lowered and lifted only in a vertical direction with respect to the base frame.

7. The device of claim 1, wherein a fastening screw is provided with each coupling element to provide an additional fixation of the pin in the receptacle.

8. The device of claim 7, wherein the pin, which is slidably mounted in each coupling element, is selectively made unslidable by tightening the fastening screw after the pin has reached the final position.

9. The device of claim 1, wherein the shoulder adjacent to the cylindrical portion has a generally disk-like shape with planar front surfaces.

10. The device of claim 8, where an inner front surface adjacent to the cylindrical portion is arranged flat against the second contact surface of the receptacle when in the final position, wherein the front surface and the corresponding second contact surface provide for an axial fixation of the pin in the receptacle and wherein the cylindrical portion of the pin located on the first contact surface provides for radial fixation thereof.

11. The device of claim 9, wherein the disk-like shoulder of the pin also has two parallel, opposite contact surfaces on its lateral surface, which, in the final position of the pin, are arranged without play against opposite third contact surfaces of the receptacle.

12. The device of claim 11, wherein the third contact surfaces are arranged substantially perpendicular to the second contact surface and parallel to a tangent of the first contact surface.

13. The device of claim 1, wherein the first and second contact surfaces that provide the exact positioning of the pin in the receptacle are exactly tailored, cut, lapped, or combinations thereof, after shaping.

14. The device of claim 1, wherein a base plate of the receptacle is anchored on the base frame by means of suitable screw elements.

15. The device of claim 14, wherein the screw elements are four clamping screws, which are each arranged in one of the corners of the base plate to anchor the base plate to the base frame.

16. The device of claim 14, wherein the base plates are screwed to the base frame by means of counter-plates a cushioning intermediate layer made of plastic.

17. The device of claim 1, wherein the defined direction that the pin is insertable into the receptacle is substantially perpendicular to a longitudinal direction of the pin.

* * * * *